United States Patent
Bedarida et al.

(10) Patent No.: US 6,873,551 B2
(45) Date of Patent: Mar. 29, 2005

(54) APPARATUS AND METHOD FOR A CONFIGURABLE MIRROR FAST SENSE AMPLIFIER

(75) Inventors: Lorenzo Bedarida, Vimercate (IT); Andrea Sacco, Alessandria (IT); Monica Marziani, Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/622,804

(22) Filed: Jul. 18, 2003

(65) Prior Publication Data

US 2004/0174746 A1 Sep. 9, 2004

(30) Foreign Application Priority Data

Feb. 25, 2003 (IT) ............................... TO20 03A0132

(51) Int. Cl.[7] .............................................. G11C 16/06
(52) U.S. Cl. ................................. 365/185.21; 365/210
(58) Field of Search .......................... 365/185.22, 185.21, 365/185.2, 207, 20, 210

(56) References Cited

U.S. PATENT DOCUMENTS

| | | | | |
|---|---|---|---|---|
| 5,163,021 A | * | 11/1992 | Mehrotra et al. | 365/185.03 |
| 5,198,997 A | * | 3/1993 | Arakawa | 365/185.21 |
| 6,108,259 A | * | 8/2000 | Choi et al. | 365/210 |
| 6,333,885 B1 | * | 12/2001 | Bedarida et al. | 365/208 |
| 6,366,497 B1 | * | 4/2002 | Guliani et al. | 365/185.21 |
| 6,414,876 B1 | * | 7/2002 | Harari et al. | 365/185.22 |

* cited by examiner

Primary Examiner—Gene N. Auduong
(74) Attorney, Agent, or Firm—Sierra Patent Group, Ltd.

(57) ABSTRACT

A configurable mirror sense amplifier system for flash memory having the following features. A power source generates a reference voltage. A plurality of transistors is biased at the reference voltage. The plurality of transistors is each coupled to a second transistor. Each of the plurality of transistors is also configured to provide a current for comparison with the flash memory. The reference voltage is internal, stable and independent from variations of a power supply or temperature. The plurality of transistors is in parallel with one another. A mirror transistor is coupled to the plurality of transistors. The plurality of transistors is configured so that at least one of at least one transistor is activated with a signal in order to provide the current for comparison to the flash memory. Also, the reference voltage may be modified in order to modify the current for comparison to the flash memory.

19 Claims, 5 Drawing Sheets

APPARATUS AND METHOD FOR A CONFIGURABLE MIRROR FAST SENSE AMPLIFIER

CROSS-REFERENCE TO RELATED APPLICATION

This application claims priority to Italian Application Serial Number 03A000132, filed Feb. 25, 2003.

BACKGROUND OF THE INVENTION

1. Field of the Invention

The invention relates to memory. More particularly, the invention relates to configuring a mirror sense amplifier in order to create a reference current by which to read the state of flash memory cells.

2. The State of the Art

A system for reading flash memory typically employs a differential sense amplifier to compare the amount of current flowing through a reference cell to a selected memory cell. A sensing circuit determines if the selected memory cell has logic 1 or logic 0 stored therein based on the comparison.

When the amount of current flowing through the reference cell is larger than the amount of current flowing through the selected memory cell then logic value 0 (programmed) is read from the memory cell. When the amount of current flowing through the reference cell is smaller than the amount of current flowing through the selected memory cell then logic value 1 (erased) is read from the memory cell.

A current reference, generally half the current of an erased cell (logic value 1), enables the system to determine, through comparison with the current of the memory cell, what logic value is stored in the selected memory cell. The current reference is typically set so that the system distinguishes between programmed and erased states.

A reference cell generates the reference current. The reference cell is located in an array outside the memory array in order to avoid the write and erase cycles that modify the threshold of the reference cells. The reference current is carried around the chip by a system of current mirrors.

FIG. 1 illustrates system 10 wherein local mirror 12 mirrors a reference current inside sense amplifier 15.

Sense amplifier 15 has bias circuit 17 to bias a bit line. Reference voltage generator 19 provides a voltage level, usually generated from the reference cell current, for comparator 21. Comparator 21 determines if the reading array cell is erased or programmed.

Memory access time depends on how rapidly the reference current circuit can turn on. Node 16 is precharged at a reference value and allowed to evolve. Equalization circuitry (not shown) permits the evolution of charge at node 16. The equalization circuitry produces a load effect on a signal on line 18.

One drawback to the aforementioned design is that since the signal on line 18 is the same for all sense amplifiers 15, the load effect may reduce the performance for fast memory access. Additionally, the added load effect of the equalization circuitry increases memory access time. Furthermore, frequent reading of the memory cells may change the threshold voltages of the reference cells and therefore compromise their reliability.

The minimum Vcc for circuit 20 used to bias the reference cell depends on p-channel transistor 11 in diode configuration and on cascode 13 that biases the reference bit line at about 1V, so that if transistor 11 is conductive enough then its $V_{GS}$ can be approximated to its threshold VthP1 and minimum Vcc is $$V_{CC} = V_{THP1} + 1V + V_{DSATN1}.$$

In modern, low voltage circuits the minimum Vcc should be as low as possible.

BRIEF DESCRIPTION OF THE INVENTION

The invention provides a method and apparatus for a configurable mirror sense amplifier. A configurable array of selectable transistors whereby one or more transistors serves as a current reference for memory cells in a flash memory device. The current reference is compared to the current in a memory cell and a logic level of 0 or 1 is read from the memory cell based on whether the current in the memory cell is greater than or less than the current reference.

The array is configured in order to provide a suitable current reference level that allows the system to distinguish between current in the memory cell intended to represent logic level 0 and current intended to represent logic level 1.

The array is configured by either selecting one or more transistors to serve as the current reference, or varying the voltage applied to the gate at least one of at least one transistor in order to vary the amount of current flowing through the transistor, or a combination of selecting and varying.

DETAILED DESCRIPTION OF THE INVENTION

Persons of ordinary skill in the art will realize that the following description of the invention is only illustrative and not in any way limiting. Other embodiments of this invention will be readily apparent to those skilled in the art having benefit of this disclosure.

Figure 1:
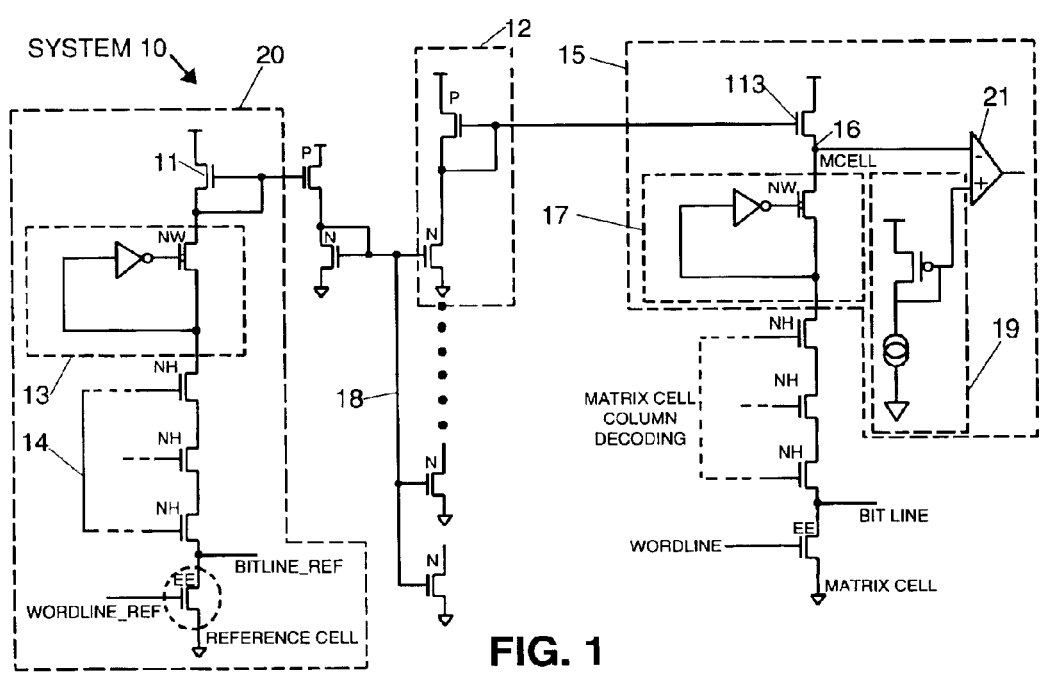
FIG. 1 is a schematic diagram illustrating a prior art memory cell content reader.
Figure 2:
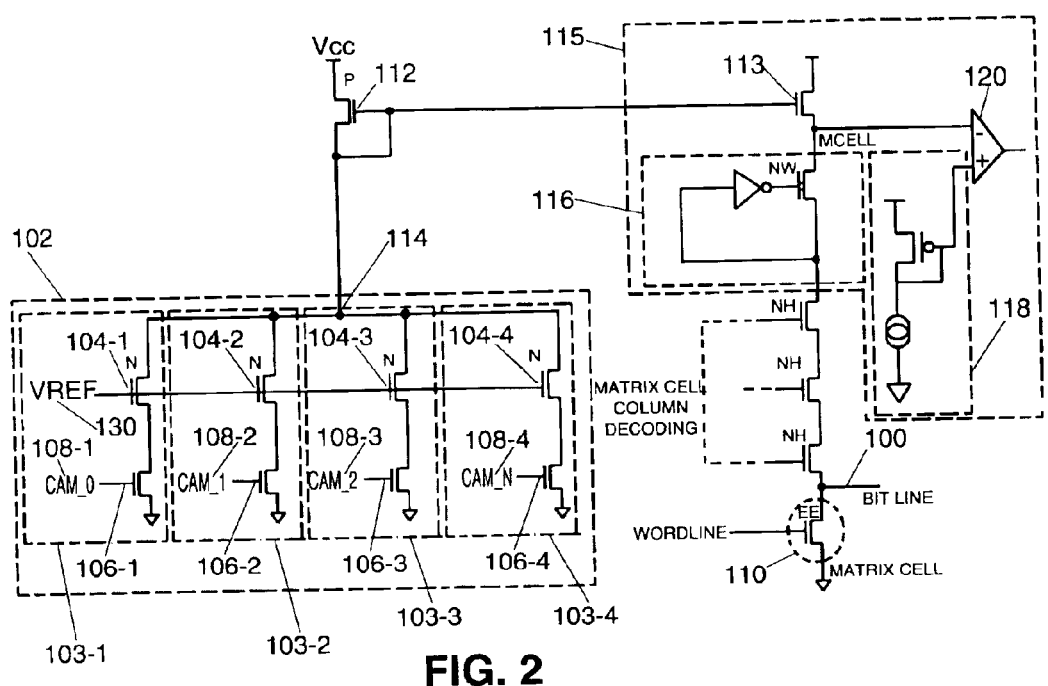
FIG. 2 is a schematic diagram illustrating one embodiment of the invention.

FIG. 2 illustrates one embodiment of the invention. Bitline current 100 is compared to one or more currents from reference circuit 102. Configurable transistors 104 (or reference transistors) are biased with the same reference voltage. The reference voltage is internally generated, stable and independent from power supply and temperature variations. In one embodiment, the reference voltage is a bandgap reference (not shown).

Current passing through transistor 112 is used as a reference current. The amount of current passing through transistor 112 is a function of how many of transistors 104 are biased to an active (conducting) mode. Transistors 104 are in a configurable array and one or more of transistors 104 are biased to an active mode in order to provide a desired current through transistor 112 and therefore a desired reference current. In one embodiment, each transistor 104 in the array is part of a group. Current through transistors 104 is selected by biasing transistors 106. For example, transistor group 103-1 is comprised of transistors 104-1 and 106-1. In order to select current passing through transistor 104-1, which is also the same current passing through transistor 106-1 and group 103-1, transistor 106-1 is biased to an active mode. Transistor group 103-2 is comprised of transistors 104-2 and 106-2. In order to select current passing through transistor group 103-2, transistor 106-2 is biased to an active mode. Transistor group 103-3 is comprised of transistors 104-3 and 106-3. In order to select current passing through transistor group 103-3, transistor 106-3 is biased to an active mode, and so on. The selected transistor group is rapidly switched on. Load effects due to transistor groups 103 allow faster access time.

The sum of the current through transistor groups 103 is the same as current through transistor 112. Current through transistor 112 is mirrored by mirror transistor 113 and compared with current in a selected memory cell, for example memory cell 110. After selecting one or more transistor groups 103, current through those groups, mirrored by transistor 113, is compared to memory cells. If current in memory cell 110 is greater than current in selected transistor group 103 then a logic level of 1 is assigned to memory cell 110. Conversely, if current in memory cell 110 is less than current in selected transistor group 103 then a logic level of 0 is assigned to memory cell 110. If more than one transistor group 103 is selected then the sum of the current through the selected groups is compared to the current in the memory cell. In one embodiment, transistors 104 are N-channel transistors operated in saturation.

The minimum for $V_{cc}$ $$V_{CC}=V_{TH}+V_{NODE1}$$

where $V_{TH}$ is approximately the threshold voltage of transistor 112 and $V_{NODE1}$ is the voltage across node 114 and ground. A lower minimum Vcc allows for a broader range of low voltage applications for the invention in comparison to circuits having a higher minimum Vcc.

Sense amplifier 115 includes circuit 116 for biasing bit line 100 and transistor 113 that forces a reference current on bit line 100. Reference voltage generator 118 provides a voltage level typically generated from the reference cell current. Comparator 120 to determines if the memory cell is erased or programmed.

With respect to FIG. 2, a reference current is typically established through experimentation. The reference current should be sufficiently above the current in the memory cell that represents a logic level of 0 and sufficiently below the current that represents a logic level of 1 so that incorrect values are not read from flash memory.

Transistor 113 mirrors the current passing through transistor 112. Once a suitable reference current is established, the current passing through transistor 112 and will be compared, through the mirror of transistor 113, to current within memory cells.

One method of establishing the reference current is with signals 108. Signals 108 activate each group based on current values passing through the respective transistors. For example, if current passing through transistors 104-1 and 104-2 provides a suitable reference current, then signals 108-1 and 108-2 will activate transistors 106-1 and 106-2. If current passing through transistor 104-4 provides a suitable reference current then signal 108-4 will activate transistor 1064. One skilled in the art will recognize that each group of transistors by itself may provide a suitable reference current, and that other combinations of groups may provide suitable reference current as well. One skilled in the art will also recognize that fewer and more groups may be used and that this example applies to the embodiment illustrated in FIG. 3 as well.

In one embodiment, this configuration occurs during device testing and is not repeated. In another embodiment, this configuration occurs during power-up for the circuit.

Another method of adjusting the reference current is by adjusting the voltage on signal 130, which couples to the gate of each of transistors 104. Changing the voltage on signal 130 will change the amount of current flowing through transistors 104. One skilled in the art will recognize that this method applies to the embodiment in FIG. 3 and that a combination of this method and the previous method may be used.

Figure 3:
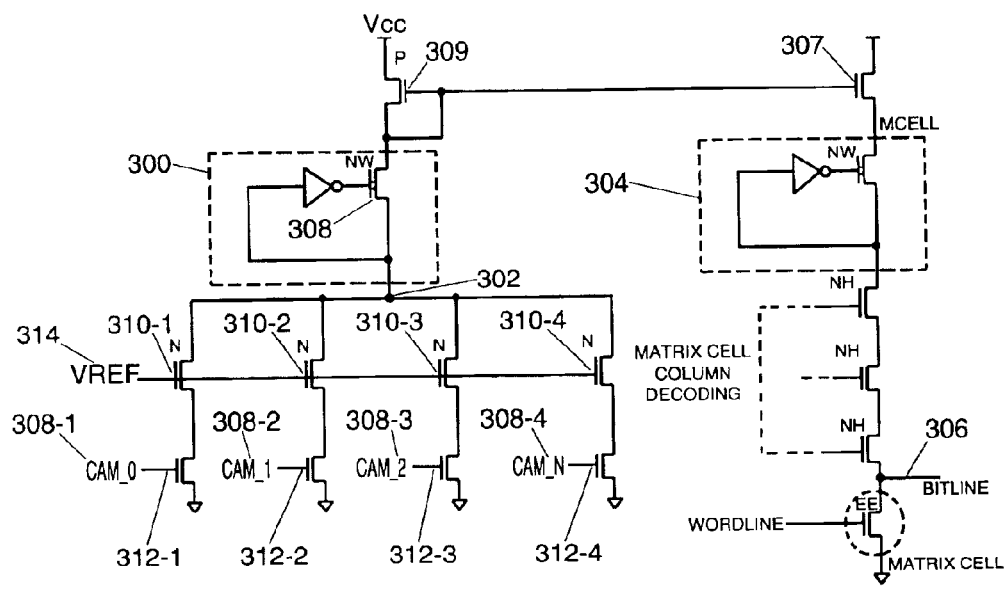
FIG. 3 is a schematic diagram illustrating one embodiment of the invention.

FIG. 3 illustrates one embodiment used to avoid Early effect. The Early effect depends on the shortening of the effective channel length in the saturation region caused by VDS being greater than the VDSAT limit. In this condition, the depletion region around the drain junction becomes wider, causing the standard drift transport equations to be replaced by more complex equations. The effect becomes more pronounced as channel length shortens.

Cascode structure 300 biases node 302. In one embodiment, bit line regulator 304 biases matrix bit line 306 at 1V while cascode structure 300 biases voltage at node 302 in order to avoid Early effect and may be lower than the voltage at node 306.

The voltage minimum for $V_{cc}$ in the circuit of FIG. 3 is $$V_{CC}=V_{TH}+V_{NODE2}+V_{DS}$$

where $V_{TH}$ is the threshold voltage of transistor 309 and $V_{NODE2}$ is the voltage across node 302 and $V_{DS}$ is the drain-to-source voltage across transistor 308. In one embodiment $V_{NODE2}$ is less than 1V. As previously stated, a minimum $V_{cc}$ lower for the invention compared to the prior art allows for a greater range of low voltage applications.

While a sense amplifier is not shown on FIG. 3, those skilled in the art recognize that the circuit in FIG. 3 can include a sense amplifier as shown in FIG. 2.

Figure 4:
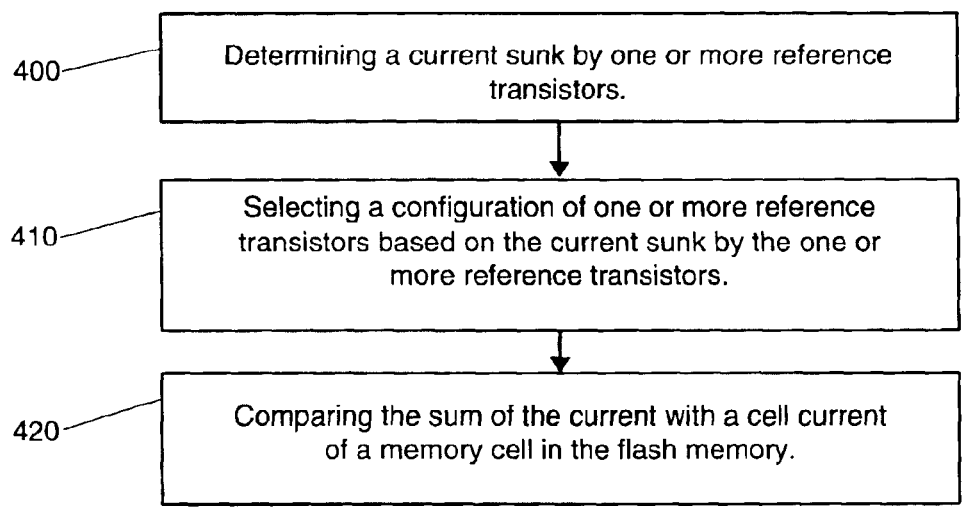
FIG. 4 is a flow diagram illustrating a method of configuring a mirror sense amplifier.

FIG. 4 is a flow diagram illustrating a method of configuring a mirror sense amplifier. In block 400, determining a current sunk by one or more reference transistors. In block 410, selecting a configuration at least one of at least one reference transistor based on the current sunk by the one or more reference transistors. In block 420, comparing the sum of the current with a cell current in a memory cell in the flash memory.

Figure 5:
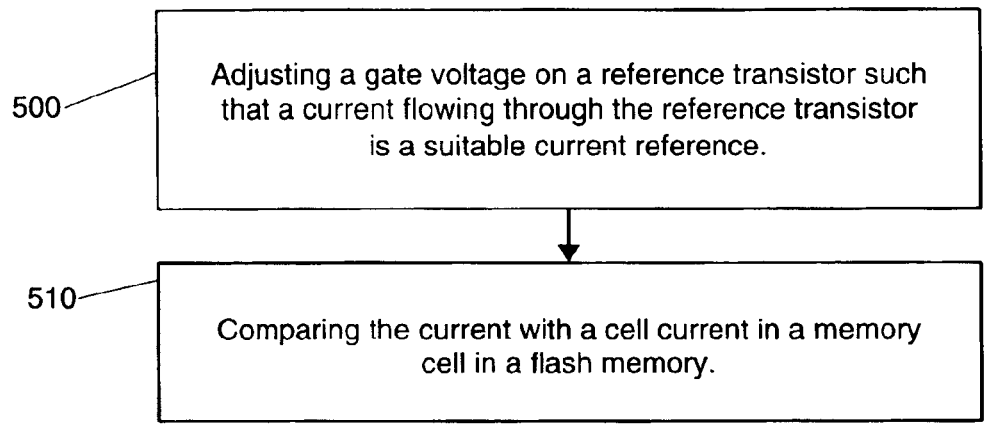
FIG. 5 is a flow diagram illustrating a method of configuring a mirror sense amplifier.

FIG. 5 is a flow diagram illustrating a method of configuring a mirror sense amplifier. In block 500, adjusting the gate voltage in a reference transistor such that a current flowing through the reference transistor is a suitable current reference. In block 510, comparing the current with a cell current in a memory cell in the flash memory.

Figure 6:
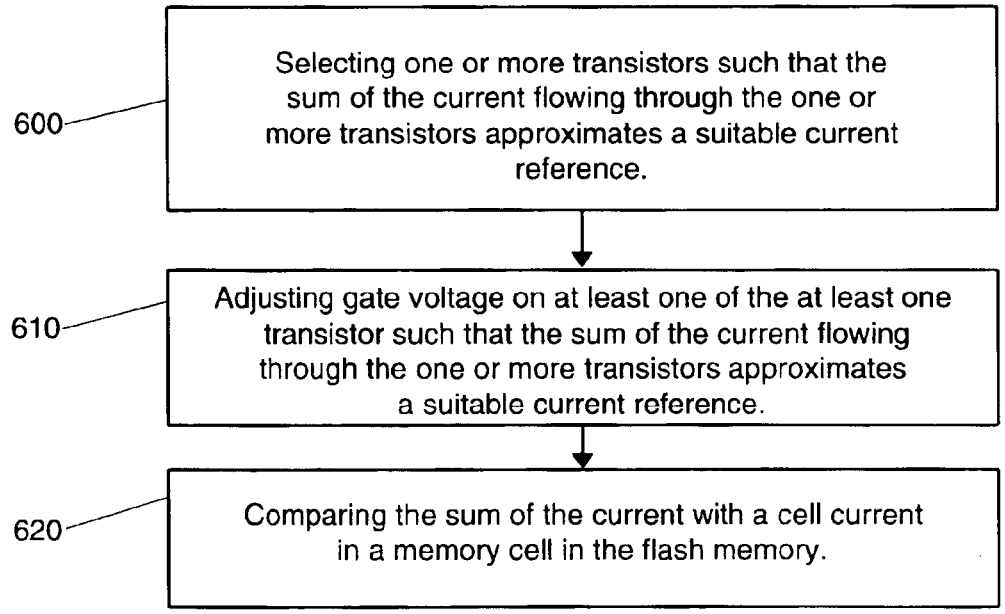
FIG. 6 is a flow diagram illustrating a method of configuring a mirror sense amplifier.

FIG. 6 is a flow diagram illustrating a method of configuring a mirror sense amplifier. In block 600, selecting one or more transistors such that the sum of the current flowing through the one or more transistors approximates a suitable current reference. In block 610, adjusting the gate voltage on at least one of at least one transistor such that the sum of the current flowing through the one or more transistors approximates a suitable current reference. In block 620, comparing the sum of the current with a cell current in a memory cell in the flash memory.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A configurable mirror sense amplifier system for flash memory comprising:
 a power source generating a reference voltage; and
 an array wherein the array comprises a first plurality of transistors and a means for selecting, each of the first plurality of transistors coupled to the means for selecting, the array biased at the reference voltage and configured to provide a current for comparison with the flash memory;
 wherein said array is configured to read said reference voltage immediately when said reference voltage is stable.

2. The system of claim 1 wherein the reference voltage is internal, stable and independent from variations of a power supply or temperature.

3. The system of claim 2 wherein each of the first plurality of transistors is in parallel.

4. The system of claim 3 further comprising a mirror transistor coupled to the array.

5. The system of claim 4 wherein a minimum voltage needed for the system is the threshold voltage of the mirror transistor plus the voltage across the array.

6. The system of claim 5 wherein the first plurality of transistors is rapidly switched on.

7. The system of claim 5 further comprising a plurality of sense amplifiers associated with the flash memory and a plurality of arrays, one of each of the plurality of sense amplifiers coupled to one of each of the plurality of arrays.

8. The system of claim 5 further comprising a plurality of sense amplifiers associated with the flash memory coupled to the array.

9. The system of claim 8 where the plurality of groups of transistors are N-channel transistors.

10. The system of claim 9 wherein the first plurality of transistors is configured such that at least one of the first plurality of transistors is activated with a signal in order to provide the current for comparison to the flash memory cell current.

11. The system of claim 10 further comprising a second plurality of transistors, one of each of the second plurality of transistors coupled to one each of the first plurality of transistors, wherein the second plurality of transistors receive the signal and activate the first plurality of transistors.

12. The system of claim 11 wherein the reference voltage is modified in order to modify the current for comparison to the flash memory cell current.

13. A configurable mirror sense amplifier system for flash memory comprising:
 a power source generating a reference voltage;
 an array wherein the array comprises a plurality of transistors each of which is coupled to a means for selecting, the group of transistors biased at the reference voltage and configured to provide a current for comparison with the flash memory; and
 a cascode structure coupled to the plurality of transistors and configured to bias the plurality of transistors in order to reduce Early effect;
 wherein said array is configured to read said reference voltage immediately when said reference voltage is stable.

14. The system of claim 13 further comprising a mirror transistor coupled to the cascode structure.

15. The system of claim 14 wherein the plurality of groups of transistors is configured such that at least one of the plurality of transistors is activated with a signal, directed to the means for selecting, in order to provide the current for comparison to the flash memory cell current.

16. The system of claim 15 wherein the reference voltage is modified in order to modify the current for comparison to the flash memory cell current.

17. A method of configuring a mirror sense amplifier system for flash memory comprising:
 determining a current sunk by one or more reference transistors;
 selecting a configuration of at least one reference transistor based on the current sunk by the at least one reference transistor; and
 comparing the sum of the current with a cell current of a memory cell in the flash memory;
 wherein said current sunk by one or more reference transistors is read immediately when said one or more reference transistors is provided a stable signal.

18. A method of configuring a mirror sense amplifier system for flash memory comprising:
 adjusting a gate voltage on a reference transistor such that the current flowing through the reference transistor is a suitable current reference; and
 comparing the current with a cell current of a memory cell in the flash memory;
 wherein said current flowing through said at least one transistor is read immediately when said at least one transistor is provided a stable signal.

19. A method of configuring a mirror sense amplifier system for flash memory comprising:
 selecting at least one transistor such that a sum of the current flowing through the at least one transistor approximates a suitable current reference;
 adjusting the gate voltage on at least one of the at least one transistor such that the current flowing through the one or more groups of transistors approximates a suitable current reference; and
 comparing the sum of the current with a cell current of a memory cell in the flash memory;
 wherein said current flowing through said at least one transistor is read immediately when said at least one transistor is provided a stable signal.

* * * * *